United States Patent [19]
Kim et al.

[11] Patent Number: 6,087,884
[45] Date of Patent: Jul. 11, 2000

[54] BIFREQUENCY OUTPUT DEVICE

[75] Inventors: Seung Hwan Kim; Seon Hee Park; Chang Soo Ryu, all of Daejon-shi, Rep. of Korea

[73] Assignee: Electronics and Telecommunications Research Institute, Daejon, Rep. of Korea

[21] Appl. No.: 09/140,319

[22] Filed: Aug. 26, 1998

[30]     Foreign Application Priority Data

Sep. 12, 1997 [KR]   Rep. of Korea ..................... 97-47175

[51] Int. Cl.$^7$ ....................................................... H03K 3/38
[52] U.S. Cl. ........................................... 327/367; 327/372
[58] Field of Search ................................... 327/366, 367, 327/369, 372, 527, 528; 505/857, 860, 861, 863, 864, 865

[56]     References Cited

U.S. PATENT DOCUMENTS 5,646,526   7/1997   Takeda et al. ......................... 324/248

5,963,351  10/1999   Kaplounenko et al. ................ 359/158

OTHER PUBLICATIONS

Jennifer Foss et al., "Multistability and Delayed Recurrent Loops", 1996 The American Physical Society, vol. 76, No. 4, Jan. 22, 1996, pp. 708–711.

*Primary Examiner*—Tuan T. Lam
*Attorney, Agent, or Firm*—Jacobson, Price, Holman & Stern, PLLC

[57]          ABSTRACT

There is disclosed a bifrequency output device. The bifrequency output device comprises Josephson junctions, a resistor for generating a given voltage in response to a pulse current which is supplied from the outside, and a time delay element for delaying the voltage generated by the resistor during a given time period and then providing it to the superconducting elements, so that the bifrequency output device outputs different low frequency and low voltage and high frequency and high voltage depending on the initial condition of the superconducting elements constituting the Josephson junctions and the voltage with a given delay time which is induced to the superconducting elements.

1 Claim, 2 Drawing Sheets

BIFREQUENCY OUTPUT DEVICE

BACKGROUND OF THE INVENTION

1. Field of the Invention

The present invention relates to a bifrequency output device which can be applied to a dynamic neural network, and more particularly to a bifrequency output device which can obtain two different frequency outputs using a superconducting element with Josephson junctions and a time-delay device.

2 Description of the Prior Art

Typically, a conventional artificial neural network uses a device statically having the value of 1 or 0 as a unit device. However, this static device has limitations on the processing of lots of data and high level recognition such as voice and image recognition. And the static device does not have image recognition functions such as object separation and object mixing. In order to overcome these limitations, recently a dynamic neural network has been proposed in a dynamic scheme, which performs the same function as biological neurons. This dynamic neural network requires a basic unit device the state of which is determined by a frequency, that is, a low frequency state and a high frequency state.

SUMMARY OF THE INVENTION

It is therefore an object of the present invention to overcome the limitations of the prior art, and to provide a bifrequency output device which can be applied to a dynamic neural network for performing processing of lots of data and a high level recognition such as voice and image recognition with object separation and object mixing.

To achieve the above object, the bifrequency output device is characterized by comprising superconducting elements with Josephson junctions; a resistor for generating a given voltage in response to a pulse current which is supplied from the outside; and a time delay element for delaying the voltage generated by the resistor during a given time period and then providing it to the superconducting elements. The bifrequency output device generates low frequency and low voltage output and high frequency and high voltage output depending on the initial condition of the superconducting elements with Josephson junctions and the delay time.

The bifrequency output device generates low frequency and low voltage output and high frequency and high voltage output depending on the initial condition of the superconducting elements with Josephson junctions. This type of bifrequency output device can be applied to an unit device of a dynamic neural network and also can be used to switch a high speed input pulse.

BRIEF DESCRIPTION OF THE DRAWINGS

The above object, and other features and advantages of the present invention will come to be clear by describing the preferred embodiment thereof with reference to the accompanying drawings, in which.

Similar reference characters refer to similar parts in the drawings.

DETAILED DESCRIPTION OF PREFERRED EMBODIMENT

Figure 1:
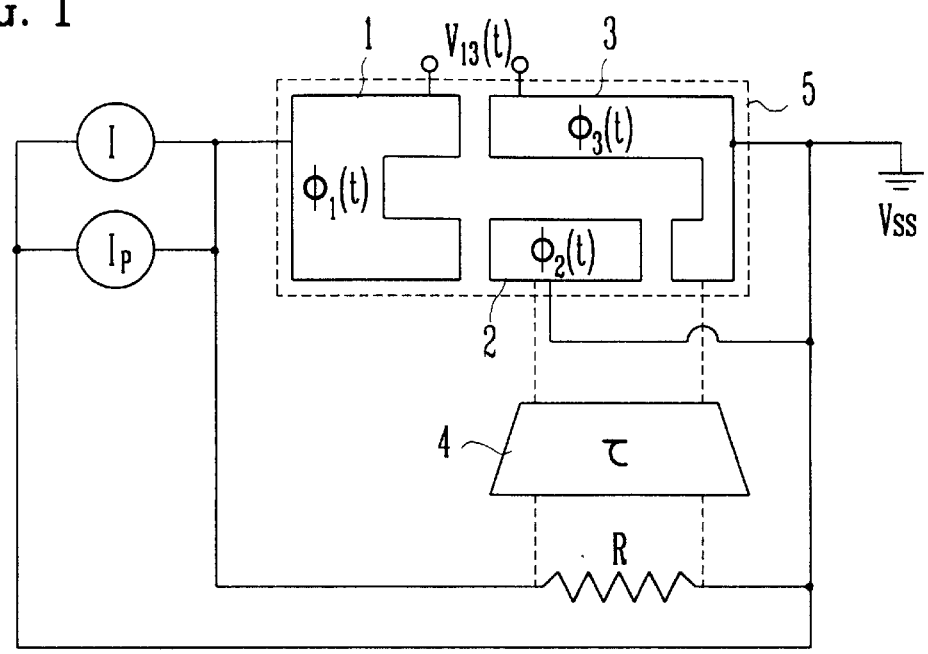
FIG. 1 shows a structure of a bifrequency output device using Josephson junctions according to the present inventionl.

FIG. 1 shows a structure of a bifrequency output device using Josephson junctions according to the present invention. Firstly, a constant current I is applied to superconducting elements 1 and 2 in a superconducting device 5. On the other hands, a pulse current $I_P$ supplied from the outside is converted into a voltage via a resistor R, and the voltage converted through the resistor R becomes a voltage having a given delay time through a delay element 4, so that the voltage can be supplied to a superconducting element 3. Here, $\Phi_1(t)$, $\Phi_2(t)$ and $\Phi_3(t)$ of the superconducting elements 1 to 3, respectively, which constitute Josephson junctions represent phases of superconducting order parameters of respective superconducting elements.

The current flowing through the superconducting elements constituting a Josephson junction is given as a sine function of the difference between the phases of the superconducting order parameters, and currents $I_{12}$, $I_{23}$ and $I_{13}$ flowing between superconducting elements 1 and 2, 2 and 3, 1 and 3, respectively, can be expressed into the following equations.

$$I_{12}(t) = I_c \sin[\Phi_1(t) - \Phi_2(t)] \qquad \text{[Equation 1]}$$

$$I_{23}(t) = I_c \sin[\Phi_2(t) - \Phi_3(t)] \qquad \text{[Equation 2]}$$

$$I_{13}(t) = I_c \sin[\Phi_1(t) - \Phi_3(t)] \qquad \text{[Equation 3]}$$

, where Ic is the critical current of the Josephson junctions. At this time, the voltages $V_{12}$, $V_{23}$ and $V_{13}$ which are applied between the Josephson junctions can be expressed into the following equations.

$$V_{12}(t) = \frac{\hbar}{2e}\frac{d}{dt}[\phi_1(t) - \phi_2(t)] \qquad \text{[Equation 2a]}$$

$$V_{23}(t) = \frac{\hbar}{2e}\frac{d}{dt}[\phi_2(t) - \phi_3(t)] \qquad \text{[Equation 2b]}$$

$$V_{13}(t) = \frac{\hbar}{2e}\frac{d}{dt}[\phi_1(t) - \phi_3(t)] \qquad \text{[Equation 2c]}$$

, where e and $\hbar$ indicate electron charge and a Flanck constant, respectively.

As shown in FIG. 1, the superconducting element 3 is grounded to a ground terminal Vss.

Therefore, as $\Phi_3(t)$ does not change with time element leading to $\Phi_3(t)=0$. Also, let the current and the voltage flowing through the resistor R to be $I_R$ and $V_R$, respectively, the following equation 3 is established according to Ohm's law.

$$V_R(t) = I_R(t) R \qquad \text{[Equation 3]}$$

Since the resistor R and the superconducting elements 1 and 3 constituting a Josephson junction are connected in parallel, the voltage $V_3(t)$ and $V_R(t)$ have the same values.

If the voltage $V_R(t)$ applied to the resistor R is applied to the superconducting elements 2 and 3 constituting a Josephson junction with a time delay $\tau$ using a time delay element, the voltage $V_{23}(t)$ has a time delay relationship with the $V_R(t)$, thus establishing the following equation 4.

$$V_{23}(t) = V_R(t-\tau) = V_{13}(t-\tau) \qquad \text{[Equation 4]}$$

Using [Equation 2] and $\Phi_3(t)=0$, the following equation 5 can be obtained.

$$\frac{d\phi_2(t)}{dt} = \frac{d\phi_1(t-\tau)}{dt} \quad \text{[Equation 5]}$$

Since the input currents I and $I_P$ are same to the sum of the current flowing through the superconducting elements 1 and 3, and 1 and 2 which constitute Josephson junctions, and the current flowing the resistor R, the following equation 6 is established.

$$I + I_P = I_{13}(t) + I_{12}(t) + I_R(t) \quad \text{[Equation 6]}$$
$$= I_c \sin\phi_1(t) + I_c \sin[\phi_1(t) - \phi_1(t-\tau)] + \frac{\hbar}{2eR}\frac{d\phi_1(t)}{dt}$$

Arranging [Equation 6] again, the following equation 7 is induced.

$$\frac{\hbar}{2eRI_c}\frac{d\phi_1(t)}{dt} = \frac{I + I_P}{I_c} \sin\phi_1(t) - \sin[\phi_1(t) - \phi_1(t-\tau)] \quad \text{[Equation 7]}$$

Expressing time t and currents I and $I_P$ in units of $h/2eRI_c$ and $I_c$, respectively, the equation 7 is simply written into the following equation 8.

$$\frac{d\phi_1(t)}{dt} = I + I_P - \sin\phi_1(t) - \sin[\phi_1(t) - \phi_1(t-\tau)] \quad \text{[Equation 8]}$$

With I=2, $I_P$=0 and τ=3, it is found that the equation 8 is bistable. In other words, it is found that two types of outputs having different frequencies in a steady state can be represented.

Figure 2:
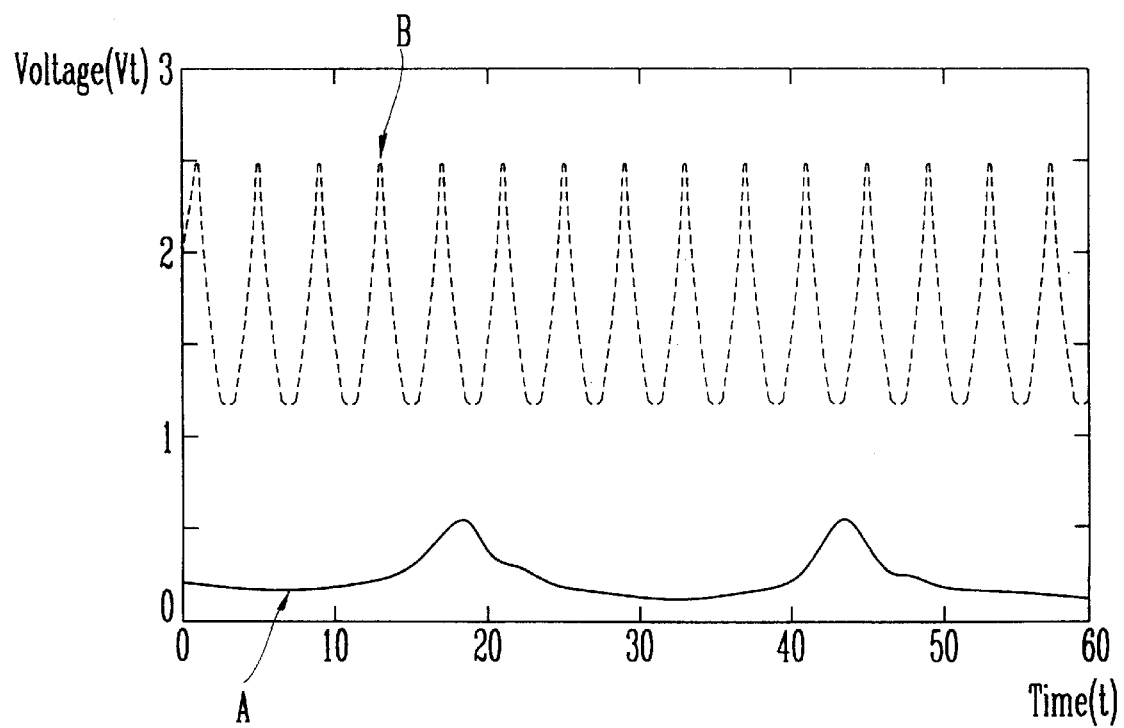
FIG. 2 shows a characteristic of a bifrequency output device using Josephson junctions according to the present invention.

FIG. 2 shows a characteristic view of a bifrequency output device using Josephson junctions according to the present invention, which shows the variation of the output voltage Vt according to the time t. It could be found that it shows the output of low frequency, low voltage (0.037 in frequency and 0.235 in voltage at A of FIG. 2) and the output of high frequency, high voltage (0.278 in frequency and 1.748 in voltage at B of FIG. 2). These outputs of low frequency and low voltage, and high frequency and high voltage can be controlled by inputting a pulse current $I_P$.

Figure 3:
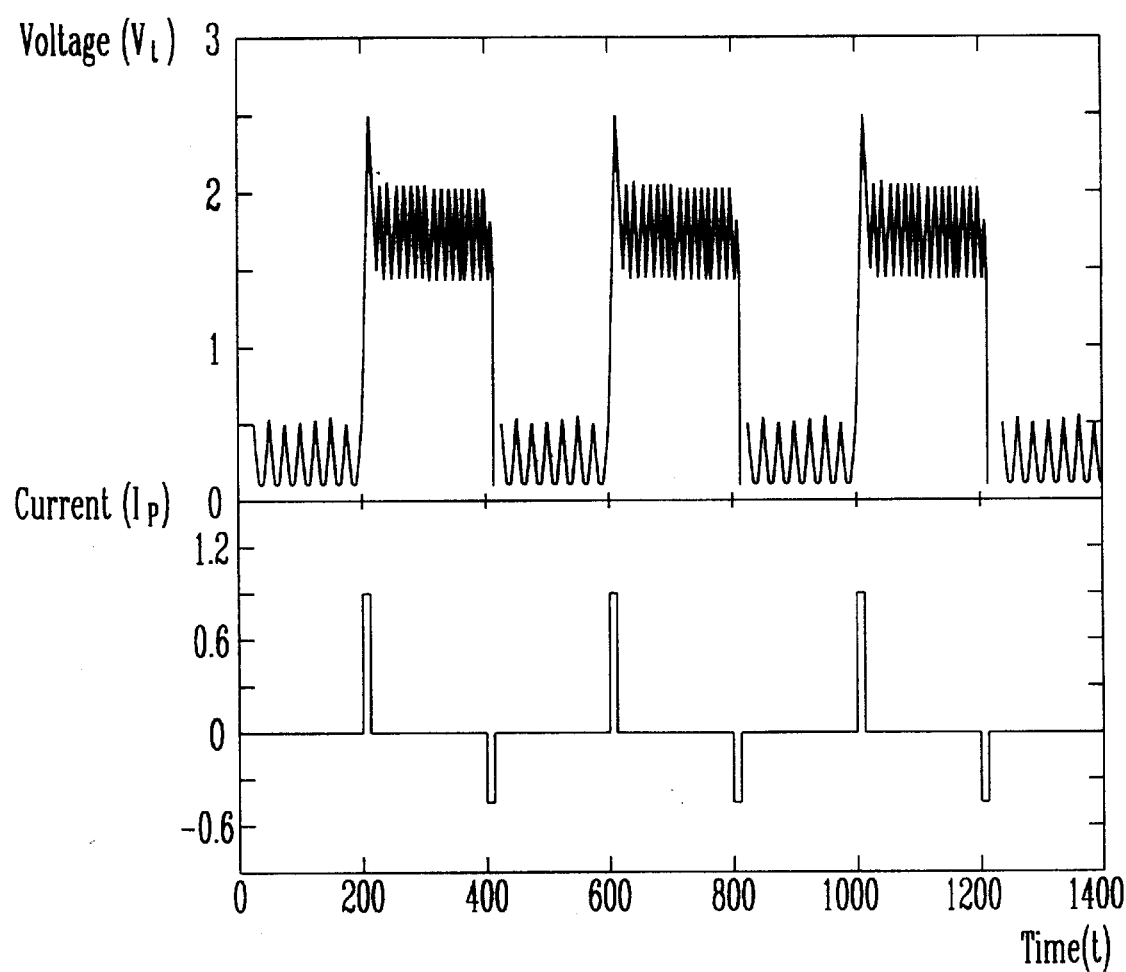
FIG. 3 shows an output switching characteristic depending on input pulses of a bifrequency output device using Josephson junctions according to the present invention.

FIG. 3 shows an output switching characteristic depending on input pulses of a bifrequency output device using a Josephson junction according to the present invention. From the drawing, it can be seen that the output of the bifrequency output device is transited between the low frequency and low voltage, and the high frequency and high voltage when the pulses of $I_P$=0.9 and –0.9 is inputted thereto at the period of 200 and during a continuing time 6 alternately.

This phenomenon of the bifrequency output device using the above mentioned Josephson junctions may be applied to a device which can switch with pulses inputted at high speed.

As described above, the bifrequency output device according to the present invention provides that it can be applied to an unit device for performing a high level of image recognition such as object separation or object mixing.

While the present invention has been described and illustrated herein with reference to the preferred embodiment thereof, it will be understood by those skilled in the art that various changes in form and details may be made therein without departing from the spirit and scope of the invention.

What is claimed is:

1. A bifrequency output device, comprising:

superconducting elements constituting Josephson junctions;

a resistor for generating a given voltage in response to a pulse current which is supplied from the outside; and a time delay element for delaying the voltage generated by the resistor during a given time period and then providing it to the superconducting elements, so that the bifrequency output device outputs low frequency and low voltage and high frequency and high voltage depending on the initial condition of the superconducting elements constituting the Josephson junction and the voltage with a given delay time which is induced to the superconducting elements.

\* \* \* \* \*